US011393385B2

United States Patent
Feng et al.

(10) Patent No.: US 11,393,385 B2
(45) Date of Patent: Jul. 19, 2022

(54) SHIFT REGISTER TO REDUCE A PROBABILITY OF DRIFTS OF THRESHOLD VOLTAGES AND DRIVING METHOD THEREFOR, GATE DRIVER CIRCUIT, AND DISPLAY DEVICE

(71) Applicants: Hefei BOE Joint Technology Co.,Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/298,112

(22) PCT Filed: Jul. 29, 2020

(86) PCT No.: PCT/CN2020/105559
§ 371 (c)(1),
(2) Date: May 28, 2021

(87) PCT Pub. No.: WO2021/018206
PCT Pub. Date: Feb. 4, 2021

(65) Prior Publication Data
US 2021/0327339 A1    Oct. 21, 2021

(30) Foreign Application Priority Data
Jul. 31, 2019    (CN) .......................... 201910703515.0

(51) Int. Cl.
*G09G 5/00*    (2006.01)
*G09G 3/20*    (2006.01)
(Continued)

(52) U.S. Cl.
CPC ......... *G09G 3/2092* (2013.01); *G09G 3/3266* (2013.01); *G09G 2300/0426* (2013.01);
(Continued)

(58) Field of Classification Search
CPC ......... G09G 3/2092; G09G 2300/0426; G09G 2310/0286; G09G 2310/061; G09G 2310/08; G09G 3/3266; G11C 19/28
See application file for complete search history.

(56) References Cited

U.S. PATENT DOCUMENTS

| 2007/0147573 A1* | 6/2007 | Tobita | .................. G09G 3/3677 377/64 |
| 2007/0217564 A1* | 9/2007 | Tobita | ................... G11C 19/28 377/64 |

(Continued)

FOREIGN PATENT DOCUMENTS

| CN | 107945762 A * | 4/2018 | ........... G11C 19/287 |
| JP | H08190365 | 7/1996 | |

OTHER PUBLICATIONS

Chinese Supplementary Search for corresponding Application No. 201910/03515.0, 2 pages, dated Jun. 16, 2021.
PCT International Search Report (w/ English translation) for corresponding PCT Application No. PCT/CN2020/105559, dated Oct. 30, 2020, 6 pages.

*Primary Examiner* — Adam J Snyder
(74) *Attorney, Agent, or Firm* — Dority & Manning, P.A.

(57) ABSTRACT

A shift register includes a first reset circuit having a first transistor and a second transistor, and a selection control circuit connected to a pull-down node, and control electrodes of the first and second transistors. First electrodes of the first and second transistors are connected to a first voltage terminal, and second electrodes of the first and second transistors are connected to a signal output terminal. The selection control circuit is configured to: control a line between the pull-down node and the control electrode of the first transistor, and a line between the pull-down node and
(Continued)

the control electrode of the second transistor to be alternately closed. The first reset circuit is configured to output a voltage of the first voltage terminal to the signal output terminal under control of a potential at the pull-down node transmitted by the selection control circuit.

17 Claims, 10 Drawing Sheets

(51) Int. Cl.
   *G09G 3/3266*   (2016.01)
   *G11C 19/28*    (2006.01)
(52) U.S. Cl.
   CPC ............... *G09G 2310/0286* (2013.01); *G09G 2310/061* (2013.01); *G09G 2310/08* (2013.01); *G11C 19/28* (2013.01)

(56) References Cited

U.S. PATENT DOCUMENTS

| | | |
|---|---|---|
| 2008/0187089 A1* | 8/2008 | Miyayama ............. G11C 19/28 377/79 |
| 2011/0157112 A1 | 6/2011 | Shibata et al. |
| 2014/0072093 A1 | 3/2014 | Shang |
| 2014/0086379 A1 | 3/2014 | Ma et al. |
| 2015/0248940 A1 | 9/2015 | Yang et al. |
| 2016/0064097 A1 | 3/2016 | Yang et al. |
| 2018/0197496 A1 | 7/2018 | Gao et al. |
| 2018/0211613 A1 | 7/2018 | Shi |
| 2019/0066620 A1* | 2/2019 | Park .................... G09G 3/3677 |
| 2019/0122625 A1 | 4/2019 | Pu et al. |
| 2019/0206503 A1* | 7/2019 | Zhang ................. G09G 3/3677 |
| 2019/0279588 A1 | 9/2019 | Kim et al. |
| 2020/0090611 A1 | 3/2020 | Han et al. |
| 2020/0273503 A1 | 8/2020 | Wang |

\* cited by examiner

SHIFT REGISTER TO REDUCE A PROBABILITY OF DRIFTS OF THRESHOLD VOLTAGES AND DRIVING METHOD THEREFOR, GATE DRIVER CIRCUIT, AND DISPLAY DEVICE

CROSS-REFERENCE TO RELATED APPLICATIONS

This application is a national phase entry under 35 USC 371 of International Patent Application No. PCT/CN2020/105559 filed on Jul. 29, 2020, which claims priority to Chinese Patent Application No 201910703515.0, filed on Jul. 31, 2019, which are incorporated herein by reference in their entirety.

TECHNICAL FIELD

The present disclosure relates to the field of display technologies, and in particular, to a shift register and a driving method therefor, a gate driver circuit, and a display device.

BACKGROUND

A gate driver circuit is integrated onto an array substrate to form gate driver on array (GOA). The GOA circuit includes a plurality of stages of cascaded GOA units. Each stage of GOA unit (i.e., shift register) is connected to at least one gate line, and serves to output a gate scanning signal to the at least one gate line. In this way, a progressive scanning of each frame of a display image may be achieved by controlling a plurality of gate lines in the array substrate by the plurality of stages of cascaded GOA units.

SUMMARY

In one aspect, a shift register is provided. The shift register includes a first reset circuit and a selection control circuit. The first reset circuit includes a first transistor and a second transistor. A first electrode of the first transistor is connected to a first voltage terminal, and a second electrode of the first transistor is connected to a signal output terminal. A first electrode of the second transistor is connected to the first voltage terminal, and a second electrode of the second transistor is connected to the signal output terminal. The selection control circuit is connected to a pull-down node, a control electrode of the first transistor, and a control electrode of the second transistor. The selection control circuit is configured to control a line between the pull-down node and the control electrode of the first transistor, and a line between the pull-down node and the control electrode of the second transistor to be alternately closed. The first reset circuit is configured to output a voltage of the first voltage terminal to the signal output terminal under control of a potential at the pull-down node transmitted by the selection control circuit.

In some embodiments, the selection control circuit is further connected to a first clock signal terminal and a second clock signal terminal. The selection control circuit is further configured to control the line between the pull-down node and the control electrode of the first transistor to be closed in response to a first clock signal provided by the first clock signal terminal. The selection control circuit is further configured to control the line between the pull-down node and the control electrode of the second transistor to be closed in response to a second clock signal provided by the second clock signal terminal.

In some embodiments, the selection control circuit includes a third transistor and a fourth transistor. A control electrode of the third transistor is connected to the first clock signal terminal, a first electrode of the third transistor is connected to the pull-down node, and a second electrode of the third transistor is connected to the control electrode of the first transistor A control electrode of the fourth transistor is connected to the second dock signal terminal, a first electrode of the fourth transistor is connected to the pull-down node, and a second electrode of the fourth transistor is connected to the control electrode of the second transistor.

In some embodiments, the shift register further includes a pull-down control circuit and a pull-up control circuit. The pull-down control circuit is connected to a second voltage terminal, a pull-up node, the pull-down node and the first voltage terminal. The pull-down control circuit is configured to output the voltage of the first voltage terminal or a voltage of the second voltage terminal to the pull-down node under control of a potential at the pull-up node. The voltage of the second voltage terminal is higher than the voltage of the first voltage terminal. The pull-up control circuit is connected to the pull-up node, the pull-down node and the first voltage terminal. The pull-up control circuit is configured to output the voltage of the first voltage terminal to the pull-up node under the control of the potential at the pull-down node.

In some embodiments, the pull-down control circuit includes a fifth transistor, a sixth transistor, a seventh transistor and an eighth transistor. A control electrode and a first electrode of the fifth transistor are both connected to the second voltage terminal, and a second electrode of the fifth transistor is connected to a control node. A control electrode of the sixth transistor is connected to the pull-up node, a first electrode of the sixth transistor is connected to the first voltage terminal, and a second electrode of the sixth transistor is connected to the control node. A control electrode of the seventh transistor is connected to the control node, a first electrode of the seventh transistor is connected to the second voltage terminal, and a second electrode of the seventh transistor is connected to the pull-down node. A control electrode of the eighth transistor is connected to the pull-up node, a first electrode of the eighth transistor is connected to the first voltage terminal, and a second electrode of the eighth transistor is connected to the pull-down node.

The pull-up control circuit includes a ninth transistor. A control electrode of the ninth transistor is connected to the pull-down node, a first electrode of the ninth transistor is connected to the first voltage terminal, and a second electrode of the ninth transistor is connected to the pull-up node.

In some embodiments, the shift register further includes an input circuit. The input circuit is connected to a signal input terminal, a pull-up node, and a second voltage terminal. The input circuit is configured to output a voltage of the second voltage terminal to the pull-up node in response to an input signal provided by the signal input terminal.

In some embodiments, the input circuit includes a tenth transistor. A control electrode of the tenth transistor is connected to the signal input terminal, a first electrode of the tenth transistor is connected to the second voltage terminal, and a second electrode of the tenth transistor is connected to the pull-up node.

In some embodiments, the shift register further includes an output circuit. The output circuit is connected to a third clock signal terminal, the pull-up node and the signal output terminal. The output circuit is configured to output a third clock signal provided by the third clock signal terminal to the signal output terminal under control of a potential at the pull-up node.

In some embodiments, the output circuit includes an eleventh transistor and a capacitor. A control electrode of the eleventh transistor is connected to the pull-up node, a first electrode of the eleventh transistor is connected to the third clock signal terminal, and a second electrode of the eleventh transistor is connected to the signal output terminal. A first electrode of the capacitor is connected to the pull-up node, and a second electrode of the capacitor is connected to the signal output terminal.

In some embodiments, the shift register further includes a second reset circuit. The second reset circuit is connected to a reset signal terminal, the pull-up node and the first voltage terminal. The second reset circuit is configured to output the voltage of the first voltage terminal to the pull-up node in response to a reset signal provided by the reset signal terminal.

In some embodiments, the second reset circuit includes a twelfth transistor. A control electrode of the twelfth transistor is connected to the reset signal terminal, a first electrode of the twelfth transistor is connected to the first voltage terminal, and a second electrode of the twelfth transistor is connected to the pull-up node.

In some embodiments, the shift register further includes an initialization circuit. The initialization circuit is connected to an initialization signal terminal, the pull-up node and the first voltage terminal. The initialization circuit is configured to output the voltage of the first voltage terminal to the pull-up node in response to an initialization signal provided by the initialization signal terminal.

In some embodiments, the initialization circuit includes a thirteenth transistor. A control electrode of the thirteenth transistor is connected to the initialization signal terminal, a first electrode of the thirteenth transistor is connected to the first voltage terminal, and a second electrode of the thirteenth transistor is connected to the pull-up node.

In some embodiments, the first transistor, the second transistor, a third transistor, a fourth transistor, a fifth transistor, a sixth transistor, a seventh transistor, an eighth transistor, a ninth transistor, a tenth transistor, an eleventh transistor, a twelfth transistor and the thirteenth transistor that are included in the shift register are all N-type transistors.

In another aspect, a gate driver circuit is provided. The gate driver circuit includes a plurality of stages of cascaded shift registers according to some embodiments described above.

In yet another aspect, a display device is provided. The display device includes the gate driver circuit according to some embodiments described above.

In yet another aspect, a driving method for a shift register is provided. The driving method is applied to the shift register according to some embodiments described above. The driving method includes: in a first period in a working cycle of the selection control circuit, controlling, by the selection control circuit, the line between the pull-down node and the control electrode of the first transistor to be closed; and in a second period in the working cycle of the selection control circuit, controlling, by the selection control circuit, the line between the pull-down node and the control electrode of the second transistor to be closed. The first period and the second period each include at least one frame time.

In some embodiments, in the working cycle, the first period is before the second period, or the second period is before the first period.

In some embodiments, the selection control circuit is connected to a first clock signal terminal and a second clock signal terminal. The driving method further includes: in the first period, controlling, by the selection control circuit, the line between the pull-down node and the control electrode of the first transistor to be closed, in response to an effective level in a first clock signal provided by the first clock signal terminal; and in the second period, controlling, by the selection control circuit, the line between the pull-down node and the control electrode of the second transistor to be closed, in response to an effective level in a second clock signal provided by the second clock signal terminal. The first clock signal and the second clock signal are a set of inverted clock signals.

In some embodiments, duty ratios of the first clock signal and the second clock signal are 50%. The working cycle of the selection control circuit is a same as clock cycles of the first clock signal and the second clock signal, and a value range of each of the working cycle, and the clock cycles of the first clock signal and the second clock signal is from 1 s to 20 s.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, an actual process of a method and actual timings of signals to which the embodiments of the present disclosure relate.

DETAILED DESCRIPTION

Figure 1:
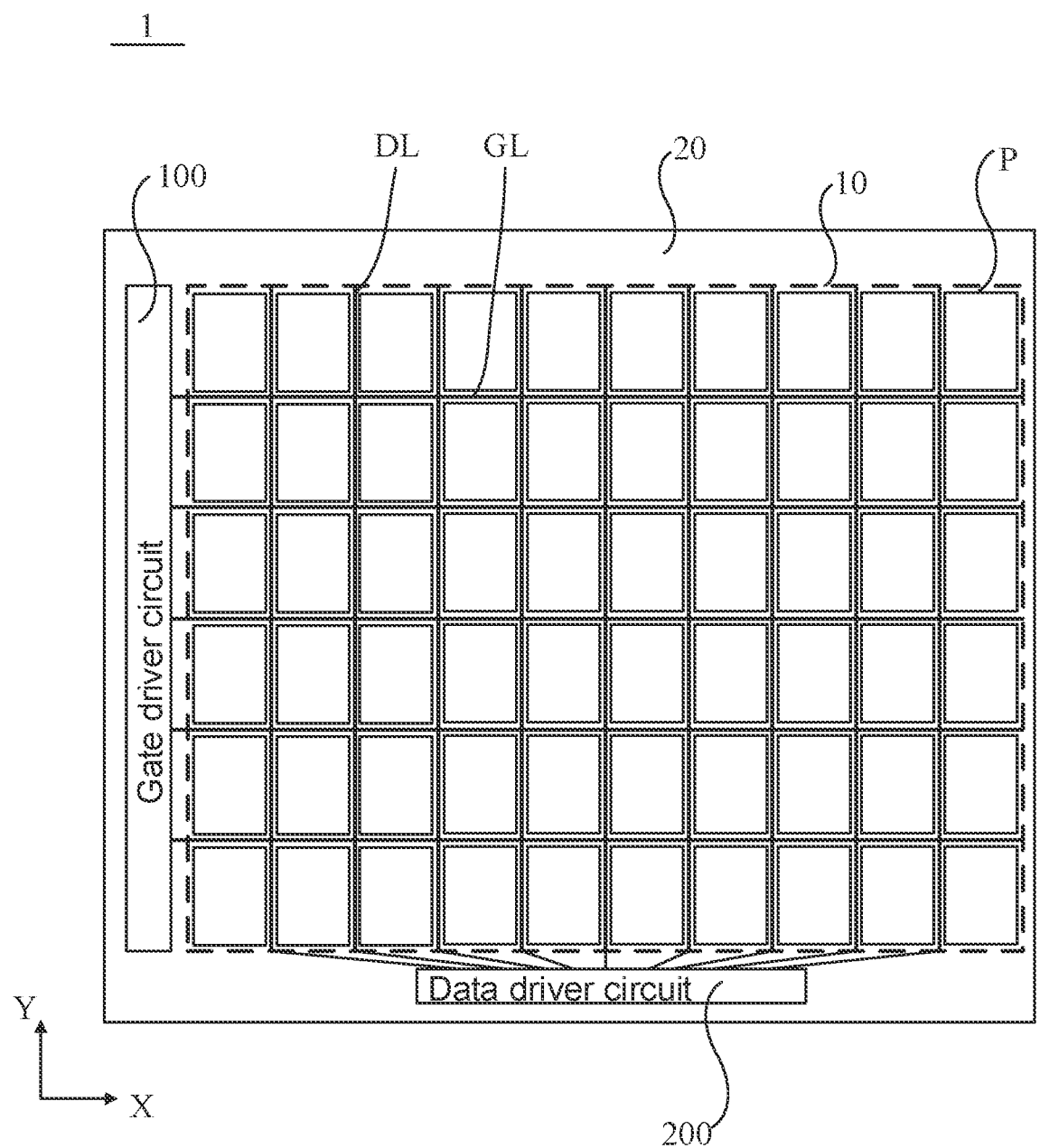
FIG. 1 is a schematic diagram showing a structure of an array substrate, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the description and the claims are construed as open and inclusive, i.e., "inclusive, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first", "second", and the like are used for descriptive purposes only, and are not to be construed as indicating or implying the relative importance or implicitly indicating the number of indicated technical features. Thus, features defined as "first", "second", and the like may explicitly or implicitly include one or more of the features. In the description of the embodiments of the present disclosure, the term "a/the plurality of" means two or more unless otherwise specified.

In the description of some embodiments, the terms "coupled" and "connected" and their extensions may be used. For example, the term "connected" may be used in the description of some embodiments to indicate that two or more components are in direct physical or electric contact with each other. For another example, the term "coupled" may be used in the description of some embodiments to indicate that two or more components are in direct physical or electric contact. However, the term "coupled" or "communicatively coupled" may also mean that two or more components are not in direct contact with each other, but still cooperate or interact with each other. The embodiments disclosed herein are not necessarily limited to the contents herein.

The use of the phrase "applicable to" or "configured to" means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary drawings. The regions shown in the accompanying drawings are schematic in nature, and their shapes are not intended to show actual shapes of the regions in a device, and are not intended to limit the scope of the exemplary embodiments.

Figure 10:
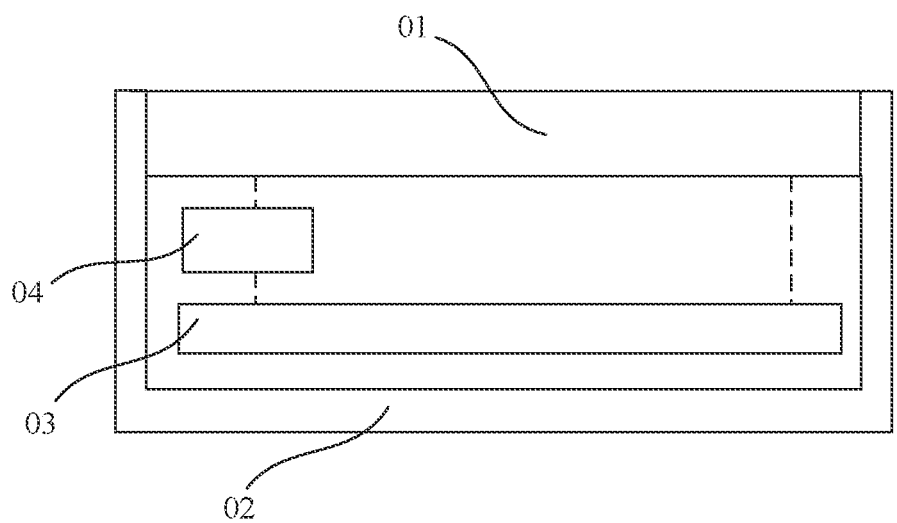
FIG. 10 is a schematic diagram showing a structure of a display device, in accordance with some embodiments of the present disclosure.

Some embodiments of the present disclosure provide a display device. The display device may be, for example, a product having a display function, such as a television, a mobile phone, a computer, a notebook computer, a tablet computer, a personal digital assistant (FDA), or a vehicle-mounted computer. In some embodiments, as shown in FIG. 10, the display device 001 includes a housing 02, and a display panel 01, a circuit board 03, a display driver chip 04 and other electronic accessories that are disposed in the housing 02, The embodiments of the present disclosure do not particularly limit a specific form of the display device.

In some embodiments, the display device 001 is a liquid crystal display (LCD) device. The liquid crystal display device includes a liquid crystal display panel and a backlight module. The liquid crystal display panel includes an array substrate, an opposite substrate, and a liquid crystal layer disposed between the array substrate and the opposite substrate.

In some other embodiments, the display device 001 is an electroluminescent display device, such as an organic light-emitting diode (OLED) display device or a quantum dot light-emitting diode (QLED) display device.

For example, the OLED display device includes an OLED display panel, a polarizer, and a glass cover plate that are sequentially arranged. The OLED display panel includes an array substrate, a plurality of OLEDs disposed in the array substrate, and an encapsulation layer. The encapsulation layer encapsulates the OLEDs in the array substrate well to prevent light-emitting performance and a service life of the OLEDs from being affected by an external environment.

Some embodiments of the present disclosure will described below by taking an example in which the display panel 01 is the OLED display panel.

Figure 2:
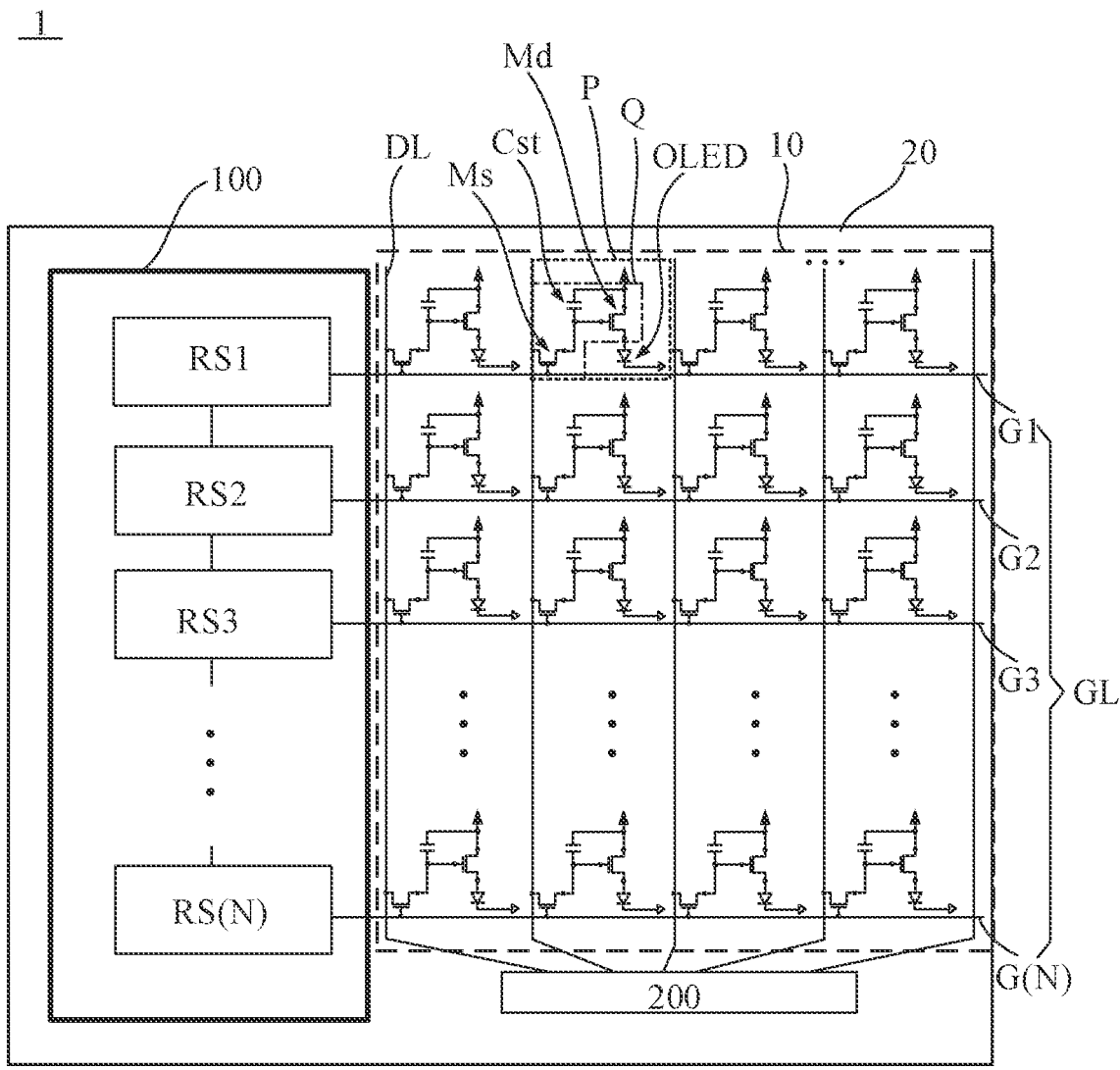
FIG. 2 is a schematic diagram showing a structure of another array substrate, in accordance with some embodiments of the present disclosure.

As will be understood with reference to FIGS. 1 and 2, some embodiments of the present disclosure provide an array substrate 1. The array substrate 1 has a display area 10 and a peripheral area 20 disposed around the display area.

The array substrate 1 includes a plurality of gate lines GL, a plurality of data lines DL, and a plurality of sub-pixels P located in the display area 10. For convenience of description, a description will be given by taking an example in which the plurality of sub-pixels P are arranged in an array in the display area 10 herein. As such, sub-pixels P arranged in a line in an X-axis direction are referred to as sub-pixels in a row. Sub-pixels P arranged in a line in a Y-axis direction are referred to as sub-pixels in a column. The plurality of sub-pixels P at least include sub-pixels of a first color, sub-pixels of a second color, and sub-pixels of a third color. The first color, the second color and the third color are three primary colors (e.g., red, green, and blue).

In some embodiments, as shown in FIG. 2, an OLED and a pixel driving circuit Q connected to the OLED are provided in each sub-pixel P. Each pixel driving circuit Q can control an OLED in a same sub-pixel P to emit light for display. The pixel driving circuit is generally composed of a plurality of thin film transistors and at least one capacitor and other electronic devices that are connected in series and parallel. Some embodiments of the present disclosure do not particularly limit a structure of the pixel driving circuit, which may be selectively set according to actual needs. Pixel driving circuits Q in sub-pixels P in a row may be connected to one gate line GL in the array substrate 1, and pixel driving circuits Q in sub-pixels P in a column may be connected to one data line DL in the array substrate 1.

For example, FIG. 2 shows a pixel driving circuit Q with a 2T1C structure (i.e., of a driving transistor Md, a switching transistor Ms, and a capacitor Cst). Control electrodes of switching transistors Ms in pixel driving circuits Q in a same row are connected to a same gate line GL, and electrodes (e.g., sources or drains) of switching transistors Ms in pixel driving circuits Q in a same column are connected to a same data line DL. For example, the pixel driving circuit Q may also have a structure of 3T1C, 6T1C or the like.

In addition, as shown in FIGS. 1 and 2, the array panel 1 further includes a gate driver circuit 100 and a data driver circuit 200 that are disposed in the peripheral area 20. The gate driver circuit 100 may be disposed in the peripheral area 20 of the array substrate 1 in an arrangement direction of the plurality of gate lines GL, and the data driver circuit 200 may be disposed in the peripheral area 20 of the array substrate 1 in an arrangement direction of the plurality of data lines DL. In this way, it facilitates to achieve a connection between the gate driver circuit 100 and the plurality of gate lines GL, and a connection between the data driver circuit 200 and the plurality of data lines DL. The date driver circuit 100 outputs gate scanning signals to the plurality of gate lines GL row by row to turn on pixel driving circuits Q row by row. After pixel driving circuits Q in a row are controlled to be turned on, the data driver circuit 200 writes pixel data voltages into corresponding pixel driving circuits Q in the row, so that each pixel driving circuit Q drives a corresponding sub-pixel P to display an image.

in some examples, the gate driver circuit 100 is a gate driver integrated circuit (IC), which is installed in the array substrate 1 in a bonding manner.

In some other examples, the gate driver circuit 100 is a gate driver on array (GOA) circuit, i.e., a circuit formed by directly integrating the gate driver circuit 100 onto the array substrate 1. Compared with the gate driver IC, the GOA circuit has advantages of low costs, few processes, high productivity, narrow bezel of a display device and the like.

The GOA circuit includes a plurality of stages of cascaded GOA units, and the GOA units are shift registers. Each stage of GOA unit is connected to at least one gate line GL, and serves to output a gate scanning signal to the at least one gate line GL, so as to drive sub-pixels P in a row corresponding to the at least one gate line GL to display an image.

For example, as shown in FIG. 2, the plurality of stages of cascaded shift registers in the GOA circuit are represented as RS1, RS2 . . . RS(N), and N is a positive integer. Each stage of shift register is connected to one gate line GL, and serves to output a gate scanning signal to the gate line GL. In this way, a progressive scanning of each frame of a display image may be achieved by controlling the plurality of gate lines GL by the plurality of stages of cascaded shift registers.

It will be noted that, FIGS. 1 and 2 only show a way of providing the gate driver circuit 100 on one side of the peripheral area 20 of the array substrate 1. A structure of the gate driver circuit 100 is as shown in FIG. 2, in which the plurality of stages of cascaded shift registers are connected to the plurality of gate lines GL in one-to-one correspondence. In this way, the plurality of stages of cascaded shift registers sequentially output gate scanning signals to the gate lines GL row by row from one side of the array substrate 1.

An arrangement of the gate driver circuit 100 in the array substrate 1 is not limited thereto. For example, gate driver circuits 100 are disposed on two opposite sides of the peripheral area 20 of the array substrate 1, and an arrangement direction of respective stages of shift registers in each gate driver circuit 100 is the same as the arrangement direction of the plurality of gate lines GL. In this way, both ends of each gate line GL are separately connected to one gate driver circuit 100, and the two gate driver circuits 100 may output gate scanning signals to the gate lines GL row by row from both ends of the gate lines GL.

Figure 3:
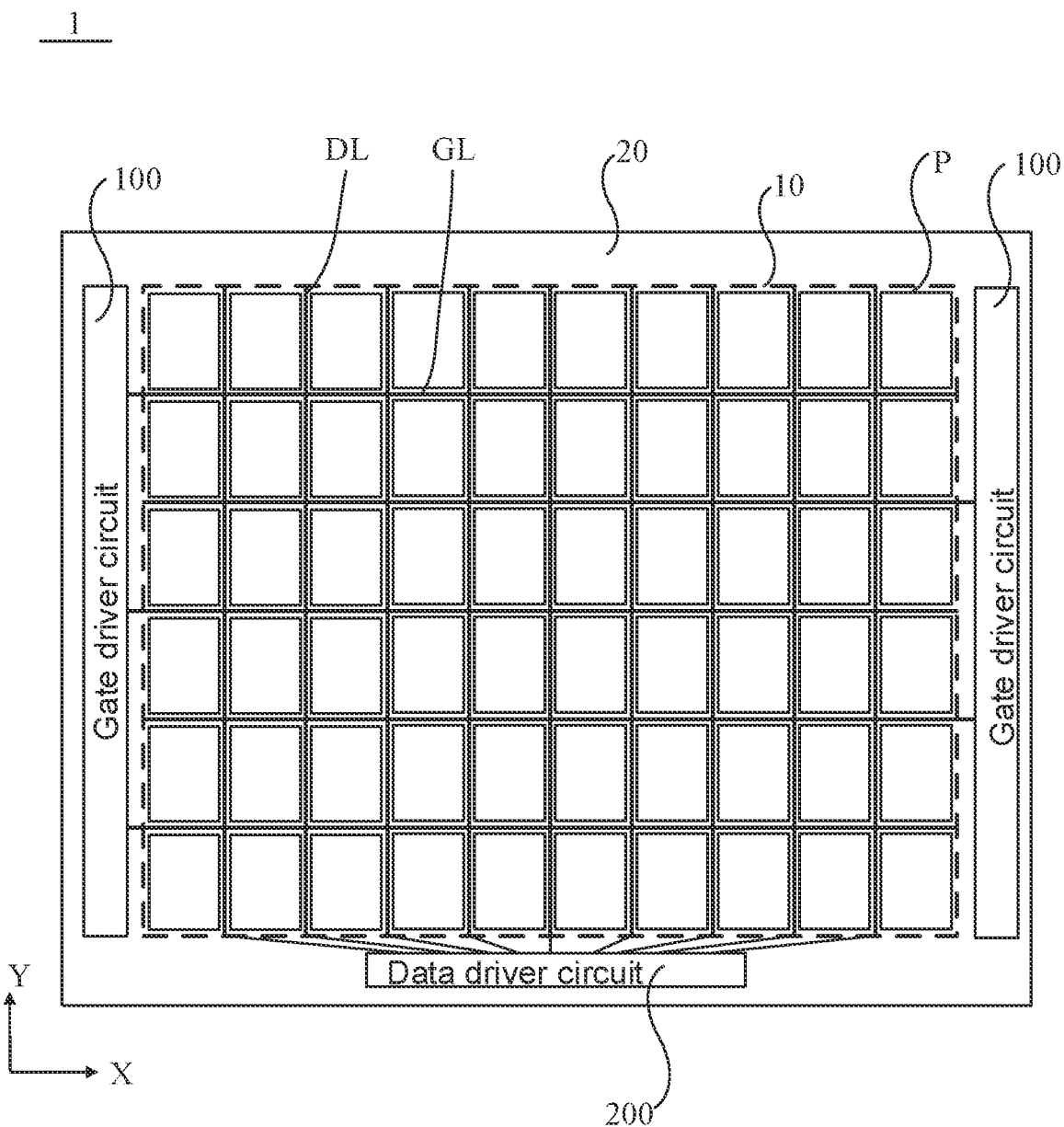
FIG. 3 is a schematic diagram showing a structure of yet another array substrate, in accordance with some embodiments of the present disclosure.

In addition, in a case where two gate driver circuits 100 are disposed in the array substrate 1, a manner in which the two gate driver circuits 100 are connected to the gate lines GL is different from the above manner. For example, as shown in FIG. 3, a gate driver circuit 100 at one end (e.g., left end) of the plurality of gate lines GL is connected to gate lines GL in odd-numbered rows, and a gate driver circuit 100 at another end (e.g., right end) of the plurality of gate lines GL is connected to gate lines GL in even-numbered rows. In this way, the gate driver circuit 100 at the left end of the plurality of gate lines GL outputs gate driving signals row by row to the gate lines GL in the odd-numbered rows, and the gate driver circuit 100 at the right end of the plurality of gate lines GL outputs gate driving signals row by row to the gate lines GL in the even-numbered rows, so that a cross output of the gate driver circuits 100 to the plurality of gate lines GL may be achieved.

Some embodiments of the present disclosure will be described below by taking an example in which the GOA circuit is disposed on one side of the peripheral area 20 of the array substrate 1. The GOA circuit includes a plurality of stages of cascaded shift registers, and each stage of shift register is correspondingly connected to one gate line GL, and can provide a gate scanning signal to the gate line GL. In one frame time, the respective stages of shift registers in the GOA circuit output the gate scanning signals to corresponding gate lines GL one by one, and the sub-pixels P in the array substrate 1 may be scanned to perform display row by row.

Figure 4:
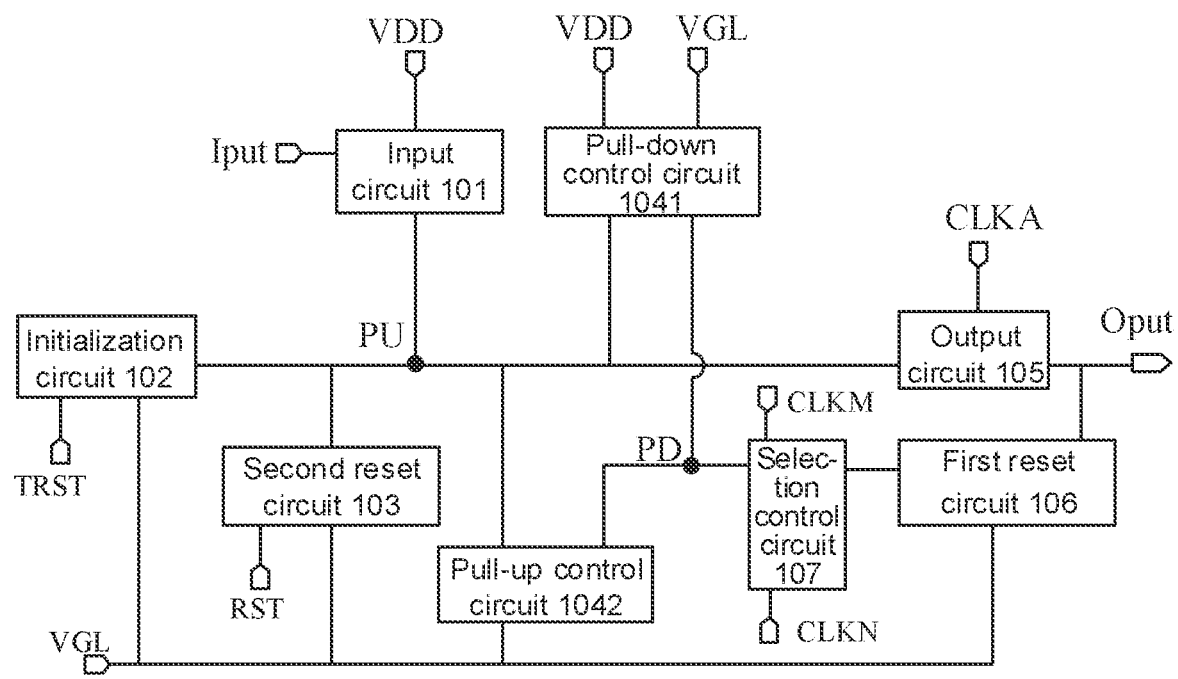
FIG. 4 is a schematic diagram showing a structure of a shift register, in accordance with some embodiments of the present disclosure.
Figure 5:
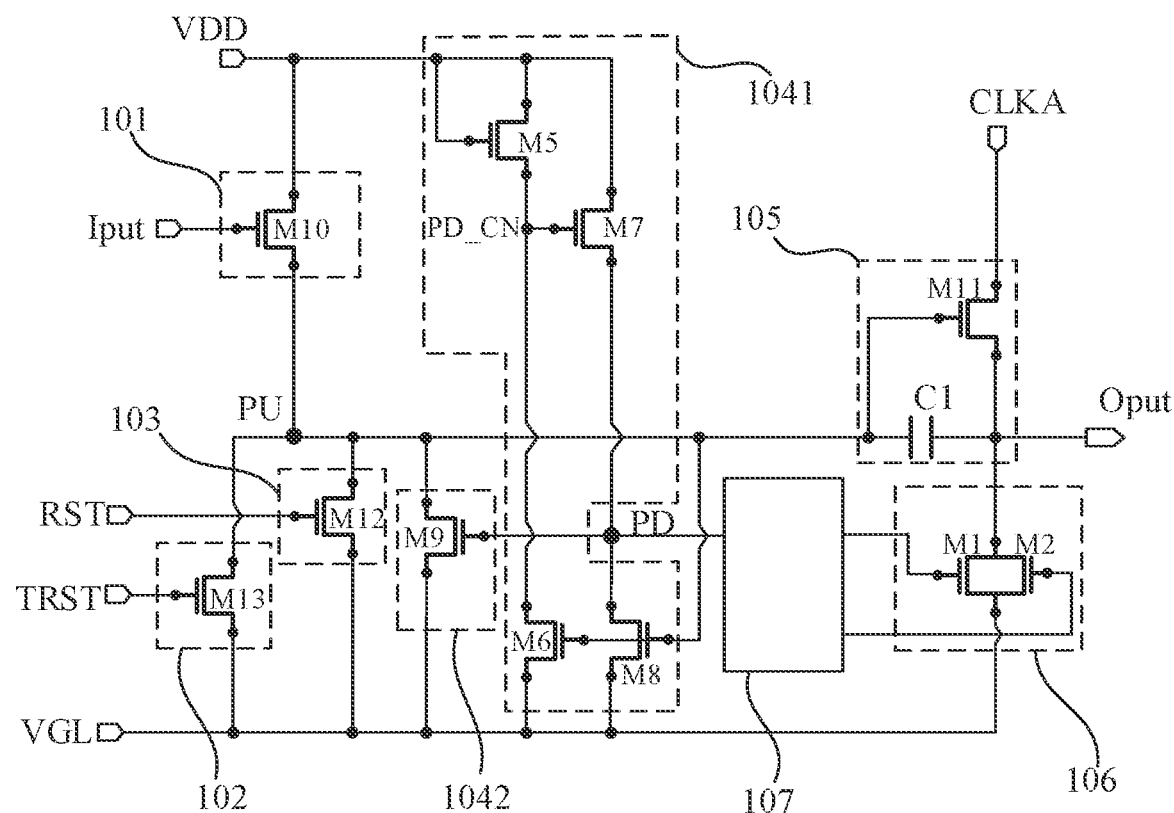
FIG. 5 is a schematic diagram showing a structure of another shift register, in accordance with some embodiments of the present disclosure.

As will be understood with reference to FIGS. 4 and 5, some embodiments of the present disclosure provide a shift register. The shift register includes: an input circuit 101 an output circuit 105, and a reset circuit. The reset circuit includes a first reset circuit 106 and a second reset circuit 103. As for structures of the circuits and an interconnection relationship among the circuits herein, reference may be made to the following embodiments. In the following embodiments, voltages of a first voltage terminal VGL and a second voltage terminal VDD may be selectively set according to actual needs, and there is no other substantial difference between the two voltage terminals except a difference in magnitudes of the voltages. Optionally, the voltage of the second voltage terminal VDD is higher than the voltage of the first voltage terminal VGL.

As shown in FIG. 4, the input circuit 101 is connected to a signal input terminal Iput, a pull-up node PU, and a second voltage terminal VDD. The input circuit 101 is configured to transmit the voltage of the second voltage terminal VOD to the pull-up node PU in response to an input signal provided by the signal input terminal Iput. One frame time includes an input phase. In the input phase of each frame, the signal input terminal Iput provides the input signal to the input circuit 101 to control the input circuit 101 to be turned on, so that the voltage of the second voltage terminal VDD is transmitted to the pull-up node PU.

The structure of the input circuit 101 may be selectively set. For example, as shown in FIG. 5, the input circuit 101 includes a tenth transistor M10. A control electrode of the tenth transistor M10 is connected to the signal input terminal Iput, a first electrode of the tenth transistor M10 is connected to the second voltage terminal VDD, and a second electrode of the tenth transistor M10 is connected to the pull-up node PU.

As shown in FIG. 4, the output circuit 105 is connected to a third dock signal terminal CLKA, the pull-up node PU, and a signal output terminal Oput. The output circuit 105 is configured to output a third clock signal provided by the third clock signal terminal CLKA to the signal output terminal Oput under control of a potential at the pull-up node PU. The frame time further includes an output phase. In the output phase of each frame, the potential at the pull-up node PU controls the output circuit 105 to be turned on, so that the third clock signal provided by the third clock signal terminal CLKA is output to the signal output terminal Oput. The third clock signal is a gate scanning signal output from the signal output terminal Oput of the shift register.

The structure of the output circuit 105 may be selectively set. For example, as shown in FIG. 5, the output circuit 105 includes an eleventh transistor M11 and a capacitor C1. A control electrode of the eleventh transistor M11 is connected to the pull-up node PU, a first electrode of the eleventh transistor M11 is connected to the third clock signal terminal CLKA, and a second electrode of the eleventh transistor M11 is connected to the signal output terminal Oput. A first electrode of the capacitor C1 is connected to the pull-up node PU, and a second electrode of the capacitor C1 is connected to the signal output terminal Oput.

As shown in FIGS. 4 and 5, the shift register further includes a selection control circuit 107. As shown in FIG. 4, the first reset circuit 106 is connected to the first voltage terminal VGL and the signal output terminal Oput, and is connected to a pull-down node PD through the selection control circuit 107. The first reset circuit 106 is configured to transmit the voltage of the first voltage terminal VGL to the signal output terminal Oput under control of a potential at the pull-down node PD, so as to reset the signal output terminal Oput. The second reset circuit 103 is connected to a reset signal terminal RST, the pull-up node PU, and the first voltage terminal VGL. The second reset circuit 103 is configured to transmit the voltage of the first voltage terminal VGL to the pull-up node PU in response to a reset signal provided by the reset signal terminal RST.

The frame time further includes a reset phase. In the reset phase of each frame, the potential at the pull-down node PD controls the first reset circuit 106 to be turned on, so that the voltage of the first voltage terminal VGL is transmitted to the signal output terminal Oput to reset the signal output terminal Oput. The reset signal terminal RST provides the reset signal to the second reset circuit 103 to control the second reset circuit 103 to be turned on and reset the pull-up node PU.

The structures of the first reset circuit 106 and the second reset circuit 103 may be selectively set. For example, as shown in FIG. 5, the first reset circuit 106 includes a first transistor M1. A control electrode of the first transistor M1 is connected to the pull-down node PD through the selection control circuit 107, a first electrode of the first transistor M1 is connected to the first voltage terminal VGL, and a second electrode of the first transistor M1 is connected to the signal output terminal Oput. The second reset circuit 103 includes a twelfth transistor M12. A control electrode of the twelfth transistor M12 is connected to the reset signal terminal RST, a first electrode of the twelfth transistor M12 is connected to the first voltage terminal VGL, and a second electrode of the twelfth transistor M12 is connected to the pull-up node PU.

As shown in FIG. 4, in some other embodiments, the shift register further includes an initialization circuit 102. The initialization circuit 102 is connected to an initialization signal terminal TRST, the pull-up node PU, and the first voltage terminal VGL. The initialization circuit 102 is configured to transmit the voltage of the first voltage terminal VGL to the pull-up node PU in response to an initialization signal provided by the initialization signal terminal. The initialization signal provided by the initialization signal terminal TRST is used for an overall reset of all shift registers in the GOA circuit. The initialization signal terminal TRST may provide the initialization signal to the initialization circuit 102 before the input phase of each frame or after the reset phase of each frame.

The frame time further includes an initialization phase. For example, the initialization phase of each frame is after the reset phase of the frame. In the initialization phase of each frame, the initialization signal terminal TRST provides the initialization signal to the initialization circuit 102 of each shift register to control the initialization circuit 102 to be turned on, so as to initialize the pull-up node PU of the shift register.

A structure of the initialization circuit 102 may be selectively set. For example, as shown in FIG. 5, the initialization circuit 102 includes a thirteenth transistor M13. A control electrode of the thirteenth transistor M13 is connected to the initialization signal terminal TRST, a first electrode of the thirteenth transistor M13 is connected to the first voltage terminal VGL, and a second electrode of the thirteenth transistor M13 is connected to the pull-up node PU.

In addition, as shown in FIGS. 4 and 5, in some embodiments, the shift register may further include a pull-down control circuit 1041 and a pull-up control circuit 1042.

The pull-down control circuit 1041 is connected to the second voltage terminal VDD, the pull-up node PU, the pull-down node PD, and the first voltage terminal VGL. The pull-down control circuit 1041 is configured to transmit the voltage of the first voltage terminal VGL or the voltage of the second voltage terminal VDD to the pull-down node PD under the control of the potential at the pull-up node PU. The pull-up control circuit 1042 is connected to the pull-up node PU, the pull-down node PD, and the first voltage terminal VGL. The pull-up control circuit 1042 is configured to transmit the voltage of the first voltage terminal VGL to the pull-up node PU under the control of the potential at the pull-down node PD.

It will be seen that, in a working process of the shift register, the pull-down control circuit 1041 serves to control the potential at the pull-down node PD to change, and the pull-up control circuit 1042 serves to control the potential at the pull-up node PU to change. The pull-up node PU and the pull-down node PD of the shift register always have a set of inverted potentials under joint control of the pull-up control circuit 1042 and the pull-down control circuit 1041, and a normal output of the signal output terminal Oput of the shift register may be ensured. For example, when the pull-up node PU is at a high potential, the pull-down node PD is at a low potential. Or, when the pull-up node PU is at a low potential, the pull-down node PD is at a high potential.

A structure of the pull-down control circuit 1041 may be selectively set. For example, as shown in FIG. 5, the pull-down control circuit 1041 includes a fifth transistor M5, a sixth transistor M6, a seventh transistor M7, and an eighth transistor M8.

A control electrode and a first electrode of the fifth transistor M5 are both connected to the second voltage terminal VDD, and a second electrode of the fifth transistor M5 is connected to a control node PD ON. A control electrode of the sixth transistor M6 is connected to the pull-up node PU, a first electrode of the sixth transistor M6 is connected to the first voltage terminal VGL, and a second electrode of the sixth transistor M6 is connected to the control node PD ON. A control electrode of the seventh transistor M7 is connected to the control node PD ON, a first electrode of the seventh transistor M7 is connected to the second voltage terminal VDD, and a second electrode of the seventh transistor M7 is connected to the pull-down node PD. A control electrode of the eighth transistor M8 is connected to the pull-up node PU, a first electrode of the eighth transistor M8 is connected to the first voltage terminal VGL, and a second electrode of the eighth transistor M8 is connected to the pull-down node PD.

A structure of the pull-up control circuit 1042 may be selectively set. For example, as shown in FIG. 5, the pull-up control circuit 1042 includes a ninth transistor M9. A control electrode of the ninth transistor M9 is connected to the pull-down node PD, a first electrode of the ninth transistor M9 is connected to the first voltage terminal VGL, and a second electrode of the ninth transistor M9 is connected to the pull-up node PU.

It will be noted that, the above descriptions of the structures of the input circuit 101, the output circuit 105, the second reset circuit 103, the initialization circuit 102, the pull-down control circuit 1041, and the pull-up control circuit 1042 are all exemplary descriptions, and are not limitations on the specific structures of the circuits. The specific structures of the input circuit 101, the output circuit 105, the second reset circuit 103, the initialization circuit 102, the pull-down control circuit 1041, and the pull-up control circuit 1042 may be selectively set according to actual needs, as long as it is ensured that functions of corresponding circuits are achieved.

In some embodiments, as shown in FIGS. 4 and 5, the first reset circuit 106 further includes a second transistor M2. A first electrode of the second transistor M2 is connected to the first voltage terminal VGL, and a second electrode of the second transistor M2 is connected to the signal output terminal Oput. The control electrode of the first transistor M1 and a control electrode of the second transistor M2 are connected to the pull-down node PD through the selection control circuit 107. The selection control circuit 107 is configured to control a line between the pull-down node PD and the control electrode of the first transistor M1, and a line between the pull-down node PD and the control electrode of the second transistor M2 to be alternately closed. That is to say, the selection control circuit 107 may selectively transmit the potential at the pull-down node PD to the control electrode of the first transistor M1 or the control electrode of the second transistor M2, so as to control the first transistor M1 or the second transistor M2 to be turned on by the potential at the pull-down node PD, Thus, the voltage of the first voltage terminal VGL may be transmitted to the signal output terminal Oput through the first transistor M1 or the second transistor M2 to reset the signal output terminal Oput.

The line between the pull-down node PD and the control electrode of the first transistor M1, and the line between the pull-down node PD and the control electrode of the second transistor M2 may be controlled to be alternately closed by providing the selection control circuit 107 in the shift register provided by the embodiments of the present disclosure. In this way, through the change of the potential at the pull-down node PD, the first transistor M1 and the second transistor M2 may be correspondingly controlled to alternately work (to be alternately turned on), thereby transmitting the voltage of the first voltage terminal VGL to the signal output terminal Oput to reset the signal output terminal Oput. Based on this, in the embodiments of the present disclosure, a probability of drifts of threshold voltages of the first transistor M1 and the second transistor M2 may be reduced by utilizing the first transistor M1 and the second transistor M2 in the first reset circuit 106 to be subjected to a bias voltage in a time-division manner, and it is possible to avoid problems of a drift of a threshold voltage of a single transistor and an abnormal output of the shift register caused by that the single transistor is subjected to the bias voltage for a long time, thereby improving output stability of the shift register, and further enhancing reliability of the gate driver circuit.

In addition, in some embodiments, the shift register is an alternating current (AC) type shift register. Providing the selection control circuit 107 in the AC type shift register may reduce the set number of groups of pull-up control circuits and pull-down control circuits in a shift register. That is, there is a need to provide combination circuits of two groups of pull-up control circuits and pull-down control circuits in an AC type shift register, so as to control a first transistor and a second transistor in a reset circuit of the AC type shift register to alternately work. However, in the embodiments of the present disclosure, a combination circuit of one group of the pull-up control circuit 1042 and the pull-down control circuit 1041 is provided, and the selection control circuit 107 is further provided, so that the first transistor M1 and the second transistor M2 may be controlled to alternately work by using the selection control circuit 107 to cooperate with the combination circuit of the pull-up control circuit 1042 and the pull-down control circuit 1041. In this way, in the embodiments of the present disclosure, it is also possible to reduce the total number of transistors in the AC type shift register, thereby facilitating the realization of the narrow bezel design of the display panel 01 and reduce costs.

Configuration of the selection control circuit 107 will be further described in the following embodiments.

Figure 6:
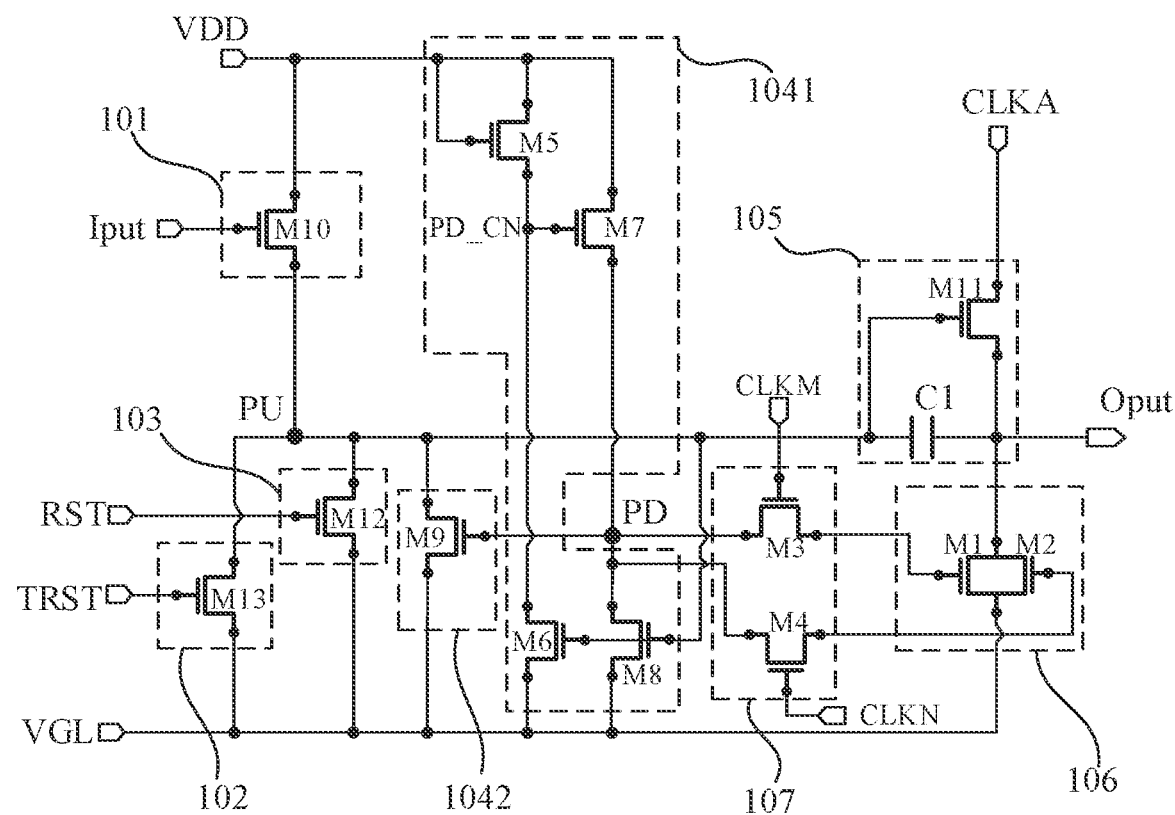
FIG. 6 is a schematic diagram showing a structure of yet another shift register, in accordance with some embodiments of the present disclosure.

In some embodiments, as shown in FIG. 6, the selection control circuit 107 is connected to a first clock signal terminal CLKM and a second clock signal terminal CLKN. In this case, the selection control circuit 107 is configured to: control the line between the pull-down node PD and the control electrode of the first transistor M1 to be closed in response to a first clock signal provided by the first clock signal terminal CLKM, and control the line between the pull-down node PD and the control electrode of the second transistor M2 to be closed in response to a second clock signal provided by the second clock signal terminal CLKN. That is, a selection control function of the selection control circuit 107 is achieved by responding to the first clock signal and the second clock signal.

For example, the first clock signal provided by the first clock signal terminal CLKM and the second clock signal provided by the second clock signal terminal CLKN are a set of inverted clock signals. For example, when the first clock signal is a high level signal, the second clock signal is a low level signal, or when the first clock signal is a low level signal, the second clock signal is a high level signal.

In some embodiments, as shown in FIG. 6, the selection control circuit 107 includes a third transistor M3 and a fourth transistor M4. A control electrode of the third transistor M3 is connected to the first clock signal terminal CLKM, a first electrode of the third transistor M3 is connected to the pull-down node PD, and a second electrode of the third transistor M3 is connected to the control electrode of the first transistor M1. A control electrode of the fourth transistor M4 is connected to the second clock signal terminal CLKN, a first electrode of the fourth transistor M4 is connected to the pull-down node PD, and a second electrode of the fourth transistor M4 is connected to the control electrode of the second transistor M2.

It will be noted that, the transistors used in the embodiments of the present disclosure may all be thin film transistors or field-effect transistors or other devices with same characteristics. In some embodiments of the present disclosure, connection manners of a drain and a source of each transistor may be interchanged. Therefore, the drain and the source of the transistor in the embodiments of the present disclosure are actually indistinguishable. Herein, only to distinguish between two electrodes of the transistor except a control electrode (i.e., gate), one of the two electrode is referred to as a drain, and the other electrode is referred to as a source.

In some embodiments, as will be understood with reference to FIG. 6, the first transistor M1, the second transistor M2, the third transistor M3, the fourth transistor M4, the fifth transistor M5, the sixth transistor M6, the seventh transistor M7, the eighth transistor M8, the ninth transistor M5, the tenth transistor M10, the eleventh transistor M11, the twelfth transistor M12, and the thirteenth transistor M13 that are provided by some embodiments of the present disclosure are all N-type transistors, that is, when driving signals of the control electrodes are high level signals, the transistors are turned on. It will be conceived that, in a case where one or more transistors in the circuits provided by some embodiments of the present disclosure are P-type transistor(s), driving signal(s) corresponding to control electrode(s) of the P-type transistors) need to be adjusted accordingly.

For example, in a case where the first clock signal terminal CLKM provides a high level, the third transistor M3 is turned on; and meanwhile, the second clock signal terminal CLKN provides a low level to control the fourth transistor M4 to be turned off. At this time, the third transistor M3 transmits the potential at the pull-down node PD to the control electrode of the first transistor M1. In a case where the potential at the pull-down node PD is a high potential, the first transistor M1 is turned on to transmit the voltage of the first voltage terminal VGL to the signal output terminal Oput, so as to reset the signal output terminal Oput.

For example, in a case where the second clock signal terminal CLKN provides a high level, the fourth transistor M4 is turned on; and meanwhile, the first clock signal terminal CLKM provides a low level to control the third transistor M3 to be turned off. At this time, fourth transistor M4 transmits the potential at the pull-down node PD to the control electrode of the second transistor M2. In a case where the potential at the pull-down node PD is a high level, the second transistor M2 is turned on to transmit the voltage of the first voltage terminal VGL to the signal output terminal Oput, so as to reset the signal output terminal Oput.

In this way, in the long-time working process of the shift register, the third transistor M3 and the fourth transistor M4 is controlled to be alternately turned on by providing the first clock signal provided by the first clock signal terminal CLKM and the second clock signal provided by the second clock signal terminal CLKN as a set of inverted clock signals, and then the first transistor M1 and the second transistor M2 is controlled to alternately work. That is, the first transistor M1 and the second transistor M2 are subjected to the bias voltage in a time-division manner, so that the probability of the drifts of the threshold voltages of the first transistor M1 and the second transistor M2 may be reduced, the output stability of the shift register may be improved, and further the reliability of the gate driver circuit 100 may be enhanced.

Based on the above technical solution of the shift register, some embodiments of the present disclosure provide a gate driver circuit 100. The gate driver circuit 100 includes a plurality of stages of cascaded shift registers as described in some embodiments described above. Beneficial effects that may be achieved by the gate driver circuit 100 provided by the embodiments of the present disclosure are the same as those that may be achieved by the shift register, and details will not be repeated herein.

Figure 7:
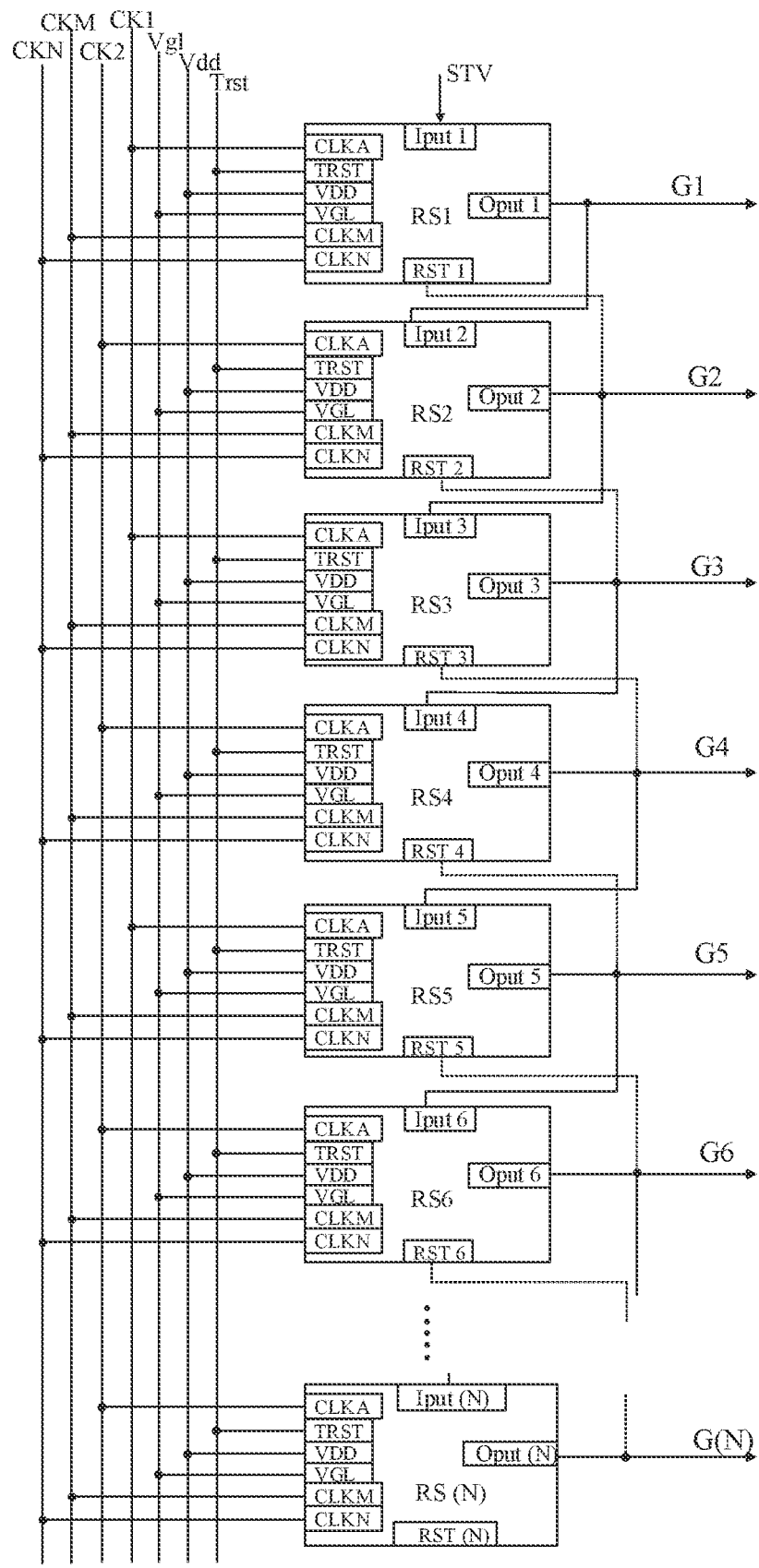
FIG. 7 is a schematic diagram showing a structure of a gate driver circuit, in accordance with some embodiments of the present disclosure.

For example, as shown in FIG. 7, the gate driver circuit 100 includes a plurality of stages of cascaded shift registers, and the shift registers have the structure of the shift registers provided by the embodiments of the present disclosure or variations thereof. A signal output terminal Oput of a shift register in each stage in the gate driver circuit 100 is connected to at least one gate line GL. For example, as shown in FIG. 7, RS1 to RS(N) in the gate driver circuit 100 are connected to gate lines GL corresponding to sub-pixels P in a first row to an N-th row in one-to-one correspondence.

A signal output from the signal output terminal Oput of the shift register in each stage may further serve as a signal required by a signal input terminal put of a next-stage shift register or shift registers in next stages cascaded with the shift register in each stage, and further serve as a signal required by a reset signal terminal RST of a previous-stage shift register or shift registers in previous stages cascaded with the shift register in each stage. Therefore, the signal output terminal Oput of the shift register in each stage may further serve as the signal input terminal Iput of the next-stage shift register or the shift registers in the next stages, or further serve as the reset signal terminal RST of the previous-stage shift register or the shift registers in the previous stages.

A description will be given below by taking the cascade manner shown in FIG. 7 as an example. The cascade manner of the plurality of stages of shift registers is not limited thereto, and other variations may also be used.

For example, as shown in FIG. 7, a signal input terminal Iput of a first-stage shift register RS1 is connected to a start signal terminal STV, and the start signal terminal STV provides an enable signal for the first-stage shift register RS1. A signal input terminal Iput(i) of an i-th-stage shift register RS(i) is connected to a signal output terminal Oput(i−1) of an (i−1)-th-stage shift register RS(i−1). i is greater than or equal to 2 and is less than or equal to N (2≤i≤N), and i is a positive integer. A reset signal terminal RST of a j-th-stage shift register RS(j) is connected to a signal output terminal Oput(j+1) of a j+1)-th-stage shift register RS(j+1). j is greater than or equal to 1 and is less than or equal to (N−1) (1≤j≤(N−1)), and j is a positive integer. A reset signal terminal RST(N) of a last-stage shift register RS(N) is separately provided.

In addition, the number of clock signal lines in the gate driver circuit 100 may be selectively set according to actual needs, as long as the first clock signal terminal, the second clock signal terminal and the third clock signal terminal in each shift register can be provided with clock signals. For example, the gate driver circuit 100 shown in FIG. 7 adopts a 2-clock signal model. That is, four clock signal lines (CK1, CK2, CKM, and CKN in FIG. 7) are disposed in the peripheral area 20 of the array substrate 1. CK1 is connected to third clock signal terminals CLKA of shift registers in odd-numbered rows in RS1, RS2 . . . RS(N). CK2 is connected to third clock signal terminals CLKA of shift registers in even-numbered rows in RS1, RS2 . . . RS(N), CKM is connected to the first clock signal terminal CLKM of the shift register in each stage. CKN is connected to the second clock signal terminal CLKN of the shift register in each stage. The number of the clock signal lines in the gate driver circuit 100 is not limited to thereto. In some other embodiments, a 6-clock signal model, an 8-clock signal model, a 10-clock signal model or the like may also be used.

In addition, the array substrate 1 is further provided with: an initialization signal line (represented by Trst in FIG. 7) connected to the initialization signal terminals TRST of the respective stages of shift registers (RS1, RS2 . . . RS(N)), a first voltage signal line (represented by Vgl in FIG. 7) connected to the first voltage terminals VGL of the respective stages of shift registers (RS1, RS2 . . . RS(N)), and a second voltage signal line (represented by Vdd in FIG. 7) connected to the second voltage terminals VOD of the respective stages of shift registers (RS1, RS2 . . . RS(N)).

Based on the above shift register, some embodiments of the present disclosure provide a driving method for the shift register. Beneficial effects that may be achieved by the driving method for the shift register provided by the embodiments of the present disclosure are the same as those that may be achieved by the shift register, and details will not be repeated herein.

In some embodiments, the structure of the shift register is shown in FIG. 6. One working cycle T of the selection control circuit 107 includes a first period t1 and a second period t2. The driving method for the shift register includes:

in the first period t1, controlling, by the selection control circuit 107, the line between the pull-down node PD and the control electrode of the first transistor M1 to be closed; and in the second period t2, controlling, by the selection control circuit 107, the line between the pull-down node PD and the control electrode of the second transistor M2 to be closed.

It will be noted that, the first period VI and the second period t2 in the working cycle T of the selection control circuit 107 are alternately arranged, and there is no need to limit a sequence of the first period t1 and the second period t2. That is, in each working cycle T, the first period t1 is before the second period t2, or the second period t2 is before the first period t1, both of which are allowed. Thus, in a working process of the selection control circuit 107, the first time period t1 and the second time period t2 are alternately cycled, thus the selection control circuit 107 can control the line between the pull-down node PD and the control electrode of the first transistor M1 and the line between the pull-down node PD and the control electrode of the second transistor M2 to be alternately closed. In this way, the first transistor M1 and the second transistor M2 can be alternately turned on under the control of the potential at the pull-down node PD.

In some embodiments, the selection control circuit 107 is connected to the first clock signal terminal CLKM and the second clock signal terminal CLKN. The driving method for the shift register further includes:

in the first period t1, controlling, by the selection control circuit 107, the line between the pull-down node PD and the control electrode of the first transistor M1 to be closed, in response to an effective level in the first dock signal provided by the first clock signal terminal CLKM; and in the second period t2, controlling, by the selection control circuit 107, the line between the pull-down node PD and the control electrode of the second transistor M2 to be closed, in response to an effective level in the second clock signal provided by the second clock signal terminal CLKN.

The effective level in the clock signal is a high level or low level, and may be selectively set according to actual needs. For example, the effective level in the first clock signal is determined according to a type of the third transistor M3, and the effective level in the second clock signal is determined according to a type of the fourth transistor M4. In addition, the effective level in the first clock signal and the effective level in the second clock signal may be a same level signal or different level signals.

For example, the third transistor M3 and the fourth transistor M4 are both N-type transistors. The first clock signal and the second clock signal are a set of inverted clock signals, the effective level in the first clock signal and the effective level in the second clock signal are both high level signals.

In some embodiments, duty ratios of the first clock signal and the second dock signal are 50%. The working cycle T of the selection control circuit 107 is the same as dock cycles of the first clock signal and the second clock signal. Correspondingly, the first period t1 is a period in which the signal in the first clock signal or the second clock signal is a high level signal, and the second period t2 is a period except the first period t1 in a same clock cycle.

Value ranges of the clock cycles of the first clock signal and the second clock signal may be selectively set according to actual needs, for example, the value ranges are from 1 s to 20 s.

For example, the clock cycles of the first clock signal and the second clock signal are 1 s. That is, the third transistor M3 and the fourth transistor M4 are alternately turned on once every 1 s (i.e., both are turned on for 0.5 s each). For example, the clock cycles of the first clock signal and the second clock signal are 20 s. In this way, the third transistor M3 and the fourth transistor M4 are alternately turned on once every 20 s (i.e., both are turned on for 10 s each). For example, the clock cycles of the first clock signal and the second clock signal are 10 s. In this way, the third transistor M3 and the fourth transistor M4 are alternately turned on once every 10 s (i.e., both are turned on for 5 s each).

It will be added that, the first period t1 and the second period t2 each include at least one frame time 1F, that is, a duration of the first period t1 and a duration of the second period t2 are both equal to a duration of the at least one frame time 1F. Thus, a switching between the alternate turning on of the third transistor M3 and the fourth transistor M4 may occur between any two adjacent frame times or among any multiple adjacent frame times. Optionally, each frame time includes an initialization phase S, and a switching between the high level and the low level in the first clock signal and the second clock signal may occur in the initialization phase S, Therefore, taking an example in which the first period t1 and the second period t2 each include one frame time 1F and the first period t1 is before the second period t2, the duration of the first period t1 and the duration of the second period t2 are both equal to a duration of the frame time 1F, and there exists a lag period to between the frame time 1F and the first period t1, and there is a lag period t0 between the frame time 1F and the second period t2.

Figure 8:
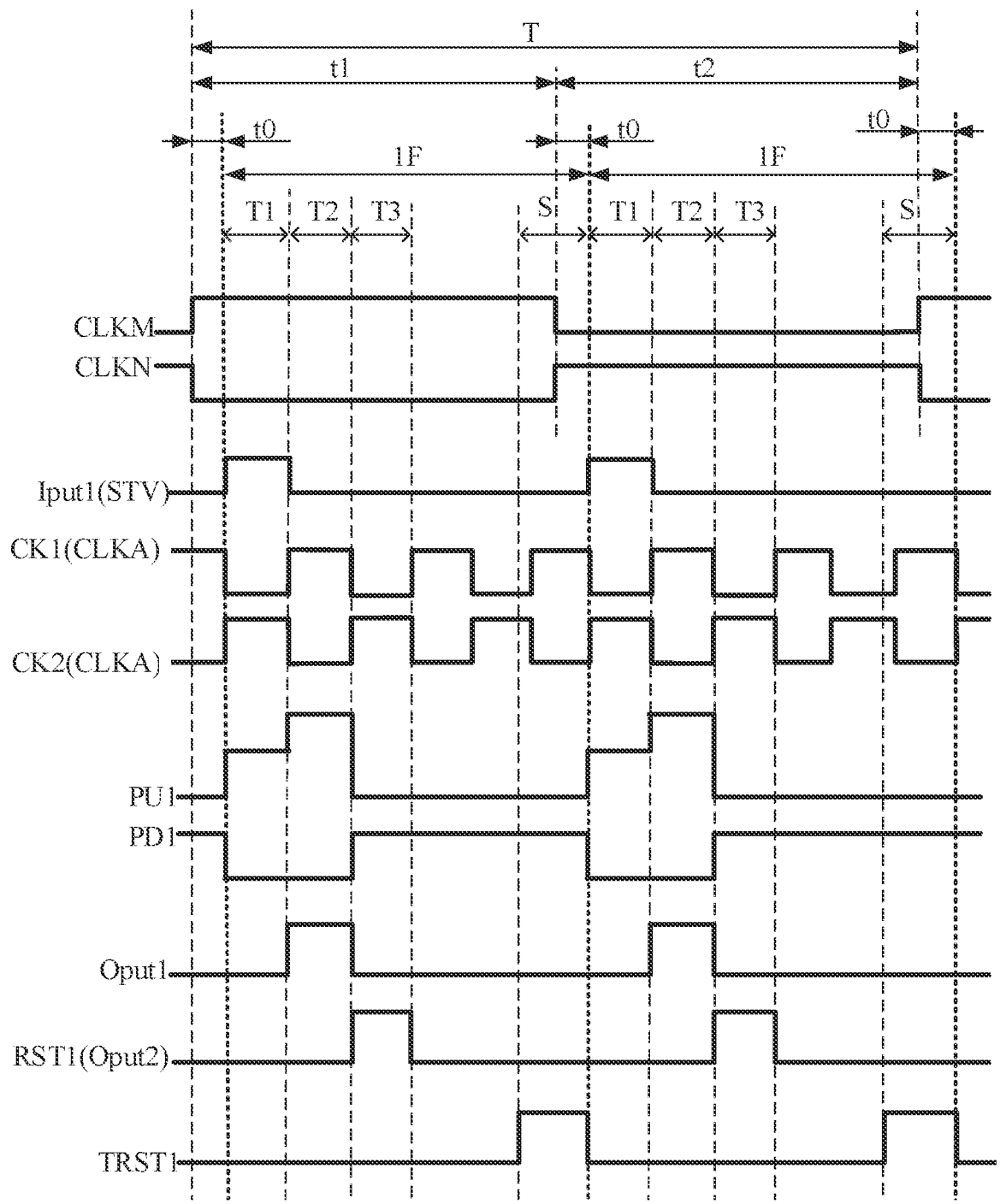
FIG. 8 is a diagram showing a driving timing for a shift register, in accordance with some embodiments of the present disclosure.

In order to clearly describe the driving method for the shift register, a description will be given below by taking the structure of the shift register shown in FIG. 6 as an example. The shift register is the first-stage shift register in the GOA circuit, and its corresponding driving timing diagram is as shown in FIG. 8. In FIG. 8, the signal input terminal Iput1, the signal output terminal Oput1, the reset signal terminal RST1, the pull-up node PU1, and the pull-down node PD1 of the shift register are all correspondingly added with a subscript 1 for illustration. It will be seen in combination with FIG. 7 that, the signal input terminal Iput1 of the shift register RS1 is connected to the start signal terminal STV, and the reset signal terminal RST1 thereof is connected to a signal output terminal Oput2 of a second-stage shift register RS2.

In some embodiments of the present disclosure, the voltage of the first voltage terminal VGL is less than the voltage of the second voltage terminal VDD. The first transistor M1, the second transistor M2, the third transistor M3, the fourth transistor M4, the fifth transistor M5, the sixth transistor M6, the seventh transistor M7, the eighth transistor M8 the ninth transistor M9, the tenth transistor M10, the eleventh transistor M11 the twelfth transistor M12 and the thirteenth transistor M13 are all the N-type transistors. A duration of one working cycle T of the selection control circuit 107 is equal to a duration of two frame times, and the duration of the first period T1 and the duration of the second period T2 are each equal to a duration of one frame time. The first clock signal provided by the first clock signal terminal CLKM is a high level signal during the first period t1, and is a low level signal during the second period t2. The second clock signal provided by the second clock signal terminal CLKN is a low level signal during the first period t1, and is a high level signal during the second period t2.

In one working cycle of the first-stage shift register, in the first period t1, the first clock signal terminal CLKM transmits a high level signal to the third transistor M3 in the selection control circuit 107 to control the third transistor M3 to be turned on. Thus, the potential at the pull-down node PD may be transmitted to the control electrode of the first transistor M1 through the third transistor M3. Meanwhile, the second dock signal terminal CLKN transmits a low level signal to the fourth transistor M4 in the selection control circuit 107 to control the fourth transistor M4 to be turned off.

Each frame time 1F includes an input phase T1, an output phase T2, a reset phase T3, and an initialization phase S.

In an input phase T1 of a first frame time:

referring to FIGS. 6 to 8, the start signal terminal STV transmits a high level, and the tenth transistor M10 in the input circuit 101 is turned on to transmit a high voltage of the second voltage terminal VDD to the pull-up node PU1 and charge the capacitor C1 in the output circuit 105. In addition, the potential at the pull-up node PU1 is a high potential, and controls the eighth transistor MB in the pull-down control circuit 1041 to be turned on, so that a low voltage of the first voltage terminal VGL can be output to the pull-down node PD1.

It will be noted that, in the input phase T1, although the fifth transistor M5 is in a normally-on state under control of the high voltage of the second voltage terminal VDD, in some embodiments, a width-to-length ratio of a channel of the sixth transistor M6 may be made greater than a width-to-length ratio of a channel of the fifth transistor M5, so as to ensure that in the input phase T1, in a case where the sixth transistor M6 is turned on, the sixth transistor M6 can transmit the low voltage of the first voltage terminal VGL to the control node PD_CN to control the seventh transistor M7 to be turned off.

In an output phase T2 of the first frame time:

referring to FIGS. 6 to 8, the capacitor C1 discharges electricity, and the potential at the pull-up node PU1 is maintained at a high potential. The eleventh transistor M11 in the output circuit 105 is turned on under control of the high potential at the pull-up node PU1, and a high level signal provided by the third clock signal terminal CLKA (i.e., the first clock signal line CK1) is output as a gate scanning signal to the signal output terminal Oput1 In addition, it will be understood that, the high level signal (i.e., the gate scanning signal) output from the signal output terminal Oput1 may further raise the potential at the pull-up node PU1 through coupling and bootstrap effects of the capacitor C1 itself.

In addition, in the output phase T2, the eighth transistor M8 in the pull-down control circuit 1041 remains to be turned on under the control of the high potential at the pull-up node PU1, and the low level voltage of the first voltage terminal VGL is continuously output to the pull-down node PD1. Turn-on or turn-off states of the fifth transistor M5, the sixth transistor M6, and the seventh transistor M7 in the pull-down control circuit 1041 are the same as those in the input phase T1.

In a reset phase T3 of the first frame time:

referring to FIGS. 6, 7 and 8, the signal output terminal Oput2 of the second-stage shift register RS2 outputs a high level signal to the reset signal terminal RST1 to control the twelfth transistor in the second reset circuit 103 to be turned on, so that the low voltage of the first voltage terminal VGL can be transmitted to the pull-up node PU1 to reset the pull-up node PU1. Meanwhile, the potential at the pull-up node PU1 is a low potential, so that the sixth transistor M6 and the eighth transistor M8 in the pull-down control circuit 1041 are in turn-off states. The fifth transistor M5 and the seventh transistor M7 are in turn-on states, so that the seventh transistor M7 transmits the high voltage of the second voltage terminal VDD to the pull-down node PD1, and the potential at the pull-down node PD1 is a high potential. At this time, the ninth transistor M9 in the pull-up control circuit 1042 is turned on, and can transmit the low voltage of the first voltage terminal VGL to the pull-down node PD1 to further reset the pull-up node PU1 Moreover, the high potential at the pull-down node Oput1 controls the first transistor M1 in the first reset circuit 108 to be turned on, and the first transistor M1 transmits the low voltage of the first voltage terminal VGL to the signal output terminal Oput1 to reset the signal output terminal Oput1.

In an initialization phase S of the first frame time:

referring to FIGS. 6, 7 and 8, the initialization signal terminal TRST transmits the initialization signal to the initialization circuit 102 of the shift register in each stage (including the first stage) to control each thirteenth transistor M13 to be turned on. In this way, the thirteenth transistor M13 can transmit the low voltage of the first voltage terminal VGL to the pull-up node PU to initialize the pull-up node PU of the shift register in each stage (including the first stage).

In addition, at any moment in this phase, the first period t1 ends, and the second period t2 is started. In the second period t2, the first clock signal terminal CLKM transmits a low level signal to the third transistor M3 in the selection control circuit 107 to control the third transistor M3 to be turned off. Meanwhile, the second clock signal terminal CLKN transmits a high level signal to the fourth transistor M4 in the selection control circuit 107 to control the fourth transistor M4 to be turned on. The potential at the pull-down node PD can be transmitted to the control electrode of the second transistor M2 through the fourth transistor M4.

After the initialization phase S of the first frame time, an input phase T1 of a second frame time is started. That is, the second frame time occurs after the second period t2.

In the input phase T1 and an output phase T2 of the second frame time, a working state of each circuit in the first-stage shift register is the same as a working state thereof in a corresponding period in the first frame time, and reference may be made to the related description in some embodiments described above.

In a reset phase T3 of the second frame time, referring to FIGS. 6, 7 and 8, the signal output terminal Oput2 of the second-stage shift register RS2 outputs a high level signal to the reset signal terminal RST1 to control the twelfth transistor in the second reset circuit 103 to be turned on, so that the low voltage of the first voltage terminal VGL can be transmitted to the pull-up node PU1 to reset the pull-up node PU1. Meanwhile, the potential at the pull-up node PU1 is a low potential, so that the sixth transistor M6 and the eighth transistor M8 in the pull-down control circuit 1041 are in turn-off states. The fifth transistor M5 and the seventh transistor M7 are in turn-on states, so that the seventh transistor M7 transmits the high voltage of the second voltage terminal VDD to the pull-down node PD1, and the potential at the pull-down node PD1 is a high potential. At this time, the ninth transistor M9 in the pull-up control circuit 1042 is turned on, and can transmit the low voltage of the first voltage terminal VGL to the pull-down node PD1 to further reset the pull-up node PU1, Moreover, the high potential at the pull-down node Oput1 controls the second transistor M2 in the first reset circuit 106 to be turned on, and the second transistor M2 transmits the low voltage of the first voltage terminal VGL to the signal output terminal Oput1 to reset the signal output terminal Oput1.

In an initialization phase S of the second frame time:

referring to FIGS. 6, 7 and 8, the initialization signal terminal TRST transmits the initialization signal to the initialization circuit 102 of the shift register in each stage (including the first stage) to control the thirteenth transistor M13 to be turned on. In this way, the thirteenth transistor M13 can transmit the low voltage of the first voltage terminal VGL to the pull-up node PU to initialize the pull-up node PU of the shift register in each stage (including the first stage).

In addition, at any moment in this phase, the second period t2 ends, and a first period t1 in a next working cycle T is started, and the driving method for the shift register is repeatedly performed.

In the embodiments of the present disclosure, in the initialization phase S of each frame time, the potential at the pull-up node PU of the shift register in each stage is initialized by using the initialization signal transmitted by the initialization signal terminal TRST, it may be ensured that when an input phase T1 of a next frame time is started, the potential at the pull-up node PU of the shift register in each stage in the gate driver circuit 100 is in an initialization state, thereby ensuring that the gate driver circuit 100 stably outputs the gate scanning signals in a driving process, and further ensuring stability of an image displayed by the display device.

It will be seen from the above that, in one working cycle T of the selection control circuit 107, there exists a lag period t0 between the first frame time 1F and the first period t1, and there exists a lag period t0 between the second frame time and the second period t2. A period in which the high level and the low level in the first clock signal provided by the first clock signal terminal CLKM and the second clock signal provided by the second clock signal terminal CLKN change is in an initialization phase S of a corresponding frame time, so that it may be ensured that the change of the high level and the low level in the first clock signal and the second clock signal does not adversely affect an output signal of the shift register.

Based on the above driving method for the shift register, some embodiments of the present disclosure provide a driving method for the gate driver circuit 100. Beneficial effects that may be achieved by the driving method for the gate driver circuit 100 provided by the embodiments of the present disclosure are the same as those that may be achieved by the gate driver circuit 100, and details will not be repeated herein.

Figure 9:
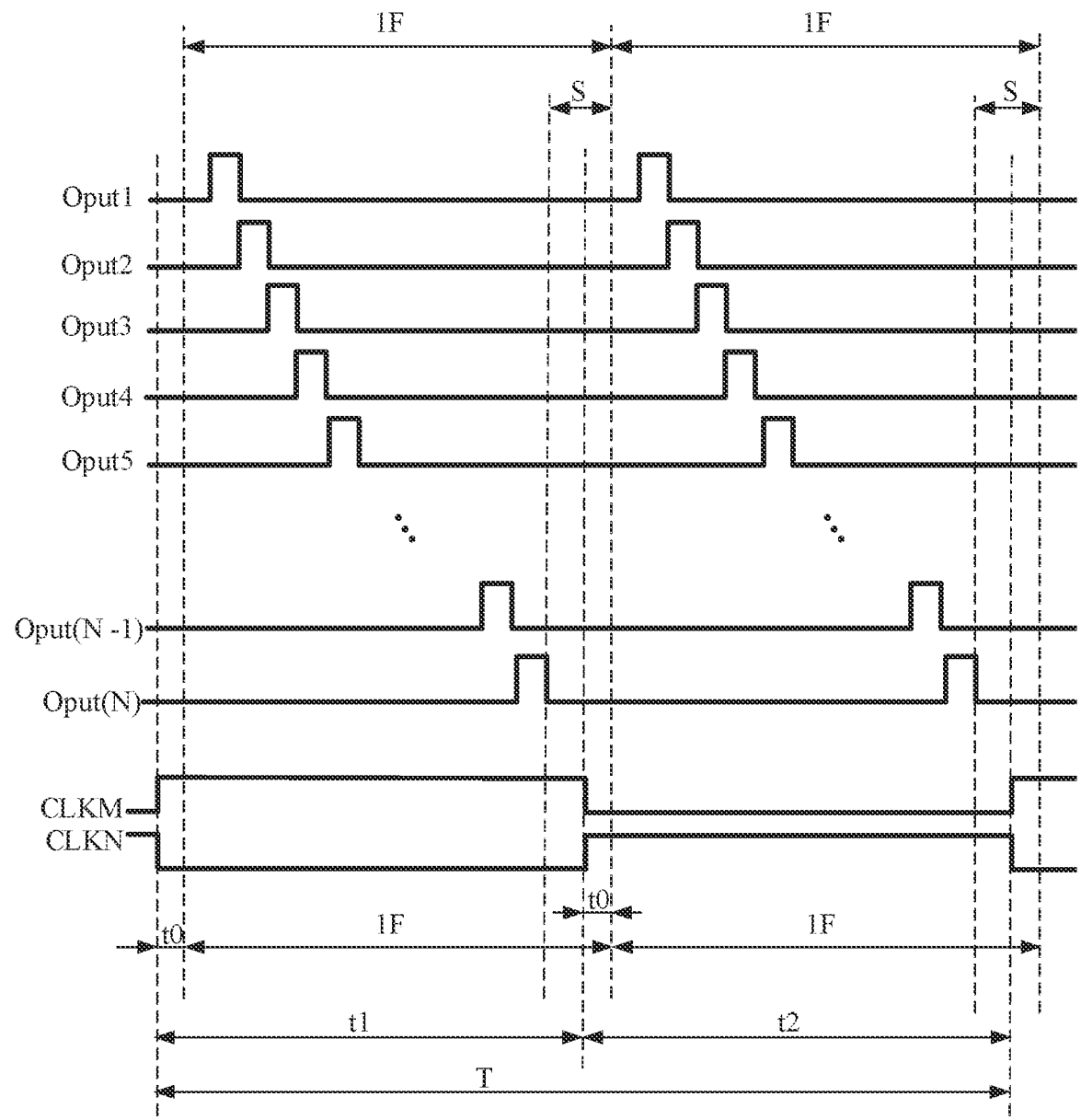
FIG. 9 is a diagram showing a driving timing for a gate driver circuit, in accordance with some embodiments of the present disclosure.

As will be understood with reference to FIG. 9, the gate driver circuit 100 is the GOA circuit, and the plurality of stages of shift registers included therein are represented as RS1, RS2 . . . RS(N), respectively, and N is a positive integer. The signal output terminals corresponding to the plurality of stages of cascaded shift registers RS1, RS2 . . . RS(N) are represented as Oput1, Oput2 Oput(N), respectively, and N is a positive integer. According to a cascade relationship among the shift registers, initialization phases S of the respective stages of shift registers in a same frame time are a same period, Output phases of the respective stages of shift registers in the same frame time are all before corresponding initialization phases S, and the output phases of the respective stage of shift registers in the frame time perform output in a time-division manner according to a cascade sequence of the respective stage of shift registers, for example, as shown in FIG. 9.

Some embodiments of the present disclosure provide a computer-readable storage medium (e.g., non-transitory computer-readable storage medium). The computer-readable storage medium stores computer program instructions that, when run on a processor, cause the processor to perform one or more steps of the driving method for the shift register as described in any one of the above embodiments.

For example, the computer-readable storage medium may include, but be not limited to, read only memory (ROM), random access memory (RAM), a magnetic storage device (e.g., hard disk, floppy disk or magnetic tape), an optical disk (e.g., compact disk (CD)), a digital versatile disk (DVD)), a smart card or a flash memory device (e.g., erasable programmable read-only memory (EPROM), a card, a stick or a key driver). Various computer-readable storage media described in some embodiments of the present disclosure may represent one or more devices and/or other machine-readable storage media for storing information. The term "machine-readable storage media" may include, but be not limited to, wireless channels and other various media capable of storing, containing and/or carrying instructions and/or data.

Some embodiments of the present disclosure provide a computer program product. The computer program product includes computer program instructions that, when executed on a computer, cause the computer to perform one or more steps of the driving method for the shift register as described in the above embodiments.

Some embodiments of the present disclosure provide a computer program. The computer program, when executed on a computer, causes the computer to perform one or more steps of the driving method for the shift register as described in the above embodiments.

Beneficial effects of the computer-readable storage medium, the computer program product and the computer program are the same as those of the driving method for the shift register as described in some embodiments described above, and details will be not repeated herein.

The foregoing descriptions are merely specific implementations of the present disclosure, but the protection scope of the present disclosure is not limited thereto, Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register, comprising:
a first reset circuit, wherein the first reset circuit includes a first transistor and a second transistor; a first electrode of the first transistor is connected to a first voltage terminal, and a second electrode of the first transistor is connected to a signal output terminal; and a first electrode of the second transistor is connected to the first voltage terminal, and a second electrode of the second transistor is connected to the signal output terminal; and
a selection control circuit connected to a pull-down node, a control electrode of the first transistor, a control electrode of the second transistor, a first clock signal terminal and a second clock signal terminal; wherein the selection control circuit is configured to: control the line between the pull-down node and the control electrode of the first transistor to be closed in response to a first clock signal provided by the first clock signal terminal, and control the line between the pull-down node and the control electrode of the second transistor to be closed in response to a second clock signal provided by the second clock signal terminal; wherein
the first reset circuit is configured to output a voltage of the first voltage terminal to the signal output terminal under control of a potential at the pull-down node transmitted by the selection control circuit;
duty ratios of the first clock signal and the second clock signal are 50%; and
the working cycle of the selection control circuit is a same as clock cycles of the first clock signal and the second clock signal, and a value range of each of the working cycle and the clock cycles of the first clock signal and the second clock signal is from 1 s to 20 s.

2. The shift register according to claim 1, wherein the selection control circuit includes a third transistor and a fourth transistor; wherein
a control electrode of the third transistor is connected to the first clock signal terminal, a first electrode of the third transistor is connected to the pull-down node, and a second electrode of the third transistor is connected to the control electrode of the first transistor; and
a control electrode of the fourth transistor is connected to the second clock signal terminal, a first electrode of the fourth transistor is connected to the pull-down node, and a second electrode of the fourth transistor is connected to the control electrode of the second transistor.

3. The shift register according to claim 1, further comprising a pull-down control circuit and a pull-up control circuit; wherein
the pull-down control circuit is connected to a second voltage terminal, a pull-up node, the pull-down node and the first voltage terminal; and the pull-down control circuit is configured to: output the voltage of the first voltage terminal or a voltage of the second voltage terminal to the pull-down node under control of a potential at the pull-up node; and the voltage of the second voltage terminal is higher than the voltage of the first voltage terminal; and
the pull-up control circuit is connected to the pull-up node, the pull-down node and the first voltage terminal; and the pull-up control circuit is configured to output the voltage of the first voltage terminal to the pull-up node under the control of the potential at the pull-down node.

4. The shift register according to claim 3, wherein the pull-down control circuit includes: a fifth transistor, a sixth transistor, a seventh transistor and an eighth transistor; wherein
a control electrode and a first electrode of the fifth transistor are both connected to the second voltage terminal, and a second electrode of the fifth transistor is connected to a control node;
a control electrode of the sixth transistor is connected to the pull-up node, a first electrode of the sixth transistor is connected to the first voltage terminal, and a second electrode of the sixth transistor is connected to the control node;
a control electrode of the seventh transistor is connected to the control node, a first electrode of the seventh transistor is connected to the second voltage terminal, and a second electrode of the seventh transistor is connected to the pull-down node; and
a control electrode of the eighth transistor is connected to the pull-up node, a first electrode of the eighth transistor is connected to the first voltage terminal, and a second electrode of the eighth transistor is connected to the pull-down node; and
the pull-up control circuit includes a ninth transistor; wherein
a control electrode of the ninth transistor is connected to the pull-down node, a first electrode of the ninth transistor is connected to the first voltage terminal, and a second electrode of the ninth transistor is connected to the pull-up node.

5. The shift register according to claim 1, further comprising an input circuit; wherein
the input circuit is connected to a signal input terminal, a pull-up node and a second voltage terminal; and the input circuit is configured to output a voltage of the second voltage terminal to the pull-up node in response to an input signal provided by the signal input terminal.

6. The shift register according to claim 5, wherein the input circuit includes a tenth transistor; wherein
a control electrode of the tenth transistor is connected to the signal input terminal, a first electrode of the tenth transistor is connected to the second voltage terminal, and a second electrode of the tenth transistor is connected to the pull-up node.

7. The shift register according to claim 5, further comprising an output circuit; wherein
the output circuit is connected to a third clock signal terminal, the pull-up node and the signal output terminal; and the output circuit is configured to output a third clock signal provided by the third clock signal terminal to the signal output terminal under control of a potential at the pull-up node.

8. The shift register according to claim 7, wherein the output circuit includes an eleventh transistor and a capacitor; wherein
a control electrode of the eleventh transistor is connected to the pull-up node, a first electrode of the eleventh transistor is connected to the third clock signal terminal, and a second electrode of the eleventh transistor is connected to the signal output terminal; and
a first electrode of the capacitor is connected to the pull-up node, and a second electrode of the capacitor is connected to the signal output terminal.

9. The shift register according to claim 5, further comprising a second reset circuit; wherein
the second reset circuit is connected to a reset signal terminal, the node and the first voltage terminal; and the second reset circuit is configured to output the voltage of the first voltage terminal to the pull-up node in response to a reset signal provided by the reset signal terminal.

10. The shift register according to claim 9, wherein the second reset circuit includes a twelfth transistor; wherein
a control electrode of the twelfth transistor is connected to the reset signal terminal, a first electrode of the twelfth transistor is connected to the first voltage terminal, and a second electrode of the twelfth transistor is connected to the pull-up node.

11. The shift register according to claim 5, further comprising an initialization circuit; wherein
the initialization circuit is connected to an initialization signal terminal, the pull-up node and the first voltage terminal; and the initialization circuit is configured to output the voltage of the first voltage terminal to the pull-up node in response to an initialization signal provided by the initialization signal terminal.

12. The shift register according to claim 11, wherein the initialization circuit includes a thirteenth transistor; wherein
a control electrode of the thirteenth transistor is connected to the initialization signal terminal, a first electrode of the thirteenth transistor is connected to the first voltage terminal, and a second electrode of the thirteenth transistor is connected to the pull-up node.

13. The shift register according to claim 12, wherein the first transistor, the second transistor, a third transistor, a fourth transistor, a fifth transistor, a sixth transistor, a seventh transistor, an eighth transistor, a ninth transistor, a tenth transistor, an eleventh transistor, a twelfth transistor and the thirteenth transistor that are comprised in the shift register are all N-type transistors.

14. A gate driver circuit, comprising a plurality of stages of cascaded shift registers according to claim 1.

15. A display device, comprising the gate driver circuit according to claim 14.

16. A driving method for a shift register, applied to the shift register according to claim 1, wherein the selection control circuit is further connected to a first clock signal terminal and a second clock signal terminal, and the driving method comprises:
in a first period in a working cycle of the selection control circuit, controlling, by the selection control circuit, the line between the pull-down node and the control electrode of the first transistor to be closed, in response to an effective level in a first clock signal provided by the first clock signal terminal; and
in a second period in the working cycle of the selection control circuit, controlling, by the selection control circuit, the line between the pull-down node and the control electrode of the second transistor to be closed in response to an effective level in a second clock signal provided by the second clock signal terminal: wherein
the first period and the second period each includes at least one frame time;
the first clock signal and the second clock signal are a set of inverted clock signals;
duty ratios of the first clock signal and the second clock signal are 50%; and
the working cycle of the selection control circuit is a same as clock cycles of the first clock signal and the second clock signal, and a value range of each of the working cycle and the clock cycles of the first clock signal and the second clock signal is from 1 s to 20 s.

17. The driving method according to claim 16, wherein in the working cycle, the first period is before the second period, or the second period is before the first period.

* * * * *

UNITED STATES PATENT AND TRADEMARK OFFICE
CERTIFICATE OF CORRECTION

| | |
|---|---|
| PATENT NO. | : 11,393,385 B2 |
| APPLICATION NO. | : 17/298112 |
| DATED | : July 19, 2022 |
| INVENTOR(S) | : Xuehuan Feng and Yongqian Li |

It is certified that error appears in the above-identified patent and that said Letters Patent is hereby corrected as shown below:

In the Claims

Column 23, Claim 9, Line 4 - "the node", should be "the pull-up node"

Signed and Sealed this
Fourteenth Day of February, 2023

*Katherine Kelly Vidal*

Katherine Kelly Vidal
*Director of the United States Patent and Trademark Office*